(12) United States Patent
Ando et al.

(10) Patent No.: US 12,262,639 B2
(45) Date of Patent: Mar. 25, 2025

(54) THERMOELECTRIC CONVERSION MATERIAL, THERMOELECTRIC CONVERSION ELEMENT, THERMOELECTRIC CONVERSION MODULE, AND METHOD FOR PRODUCING THE THERMOELECTRIC CONVERSION MATERIAL

(71) Applicant: Panasonic Intellectual Property Management Co., Ltd., Osaka (JP)

(72) Inventors: Fuyuki Ando, Osaka (JP); Hiromasa Tamaki, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 18/525,950

(22) Filed: Dec. 1, 2023

(65) Prior Publication Data

US 2024/0099142 A1    Mar. 21, 2024

Related U.S. Application Data

(63) Continuation of application No. PCT/JP2022/017377, filed on Apr. 8, 2022.

(30) Foreign Application Priority Data

Jun. 16, 2021    (JP) .................... 2021-100341

(51) Int. Cl.
*H10N 10/852*    (2023.01)
*H10N 10/01*    (2023.01)
*H10N 10/851*    (2023.01)

(52) U.S. Cl.
CPC .......... *H10N 10/852* (2023.02); *H10N 10/01* (2023.02); *H10N 10/8556* (2023.02)

(58) Field of Classification Search
CPC .. H10N 10/852; H10N 10/8556; H10N 10/01; H10N 10/00
See application file for complete search history.

(56) References Cited

U.S. PATENT DOCUMENTS

2007/0240750 A1*    10/2007    Snyder ................ H10N 10/852
                                                                 136/238
2011/0248210 A1     10/2011    Willigan et al.

FOREIGN PATENT DOCUMENTS

JP    2013-518450    5/2013
WO    2011/094635    8/2011

OTHER PUBLICATIONS

Hong et al., "Effect of Structural Change on Thermoelectric Properties of the Chalcogenide Ge2Sb2Te5 Thin Films", 2014 ECS J. Solid State Sci. Technol. 3 P298. (Year: 2014).*

(Continued)

*Primary Examiner* — Tae-Sik Kang
(74) *Attorney, Agent, or Firm* — Rimon P.C.

(57) ABSTRACT

A thermoelectric conversion material according to the present disclosure includes Ge, Te, and Sb. The thermoelectric conversion material includes a first region and a second region. The content of Sb in the first region in terms of number density of atoms is higher than the content of Sb in the second region in terms of number density of atoms. The first region includes a dispersed phase.

14 Claims, 8 Drawing Sheets

(56) References Cited

OTHER PUBLICATIONS

Tomforde et al., "Thin Films of Ge—Sb—Te-Based Phase Change Materials: Microstructure and in Situ Transformation", Chem. Mater. 2011, 23, 3871-3878. (Year: 2011).*
International Search Report of PCT application No. PCT/JP2022/017377 dated Jul. 12, 2022.
Yi-Fen Tsai et al., "Compositional Fluctuations Locked by Athermal Transformation Yielding High Thermoelectric Performance in GeTe", Advanced Materials, vol. 33, Nov. 20, 2020, p. 2005612.

* cited by examiner

THERMOELECTRIC CONVERSION MATERIAL, THERMOELECTRIC CONVERSION ELEMENT, THERMOELECTRIC CONVERSION MODULE, AND METHOD FOR PRODUCING THE THERMOELECTRIC CONVERSION MATERIAL

TECHNICAL FIELD

The present disclosure relates to a thermoelectric conversion material, a thermoelectric conversion element, a thermoelectric conversion module, and a method for producing the thermoelectric conversion material.

BACKGROUND ART

Thermoelectric conversion materials that include Te are previously known.

For example, PTL 1 discloses a nanocomposite material having a composition represented by $(PbTe)_{1-x}(Ag_2Te)_x$ and a method for producing the nanocomposite material.

NPL 1 discloses a thermoelectric conversion material having a composition represented by $(GeTe)_{1-y}(Sb_2Te_3)_y$, where y is 0, 0.05, 0.06, 0.07, or 0.10, and a method for producing the thermoelectric conversion material.

CITATION LIST

Patent Literature

PTL 1: Japanese Unexamined Patent Application Publication No. 2013-518450

Non Patent Literature

NPL 1: Y. Tsai et al., "Compositional Fluctuations Locked by A thermal Transformation Yielding High Thermoelectric Performance in Ge Te", Advanced Materials, Vol. 33, Issue 2005612 (2020) [DOI: 10.1002/adma.202005612].

SUMMARY OF INVENTION

Technical Problem

The present disclosure provides a novel thermoelectric conversion material.

Solution to Problem

The present disclosure provides a thermoelectric conversion material including Ge, Te, and Sb, wherein
the thermoelectric conversion material includes first and second regions,
a content of Sb in the first region in terms of number density of atoms is higher than a content of Sb in the second region in terms of number density of atoms, and
the first region includes a dispersed phase.

Advantageous Effects of Invention

According to the present disclosure, a novel thermoelectric conversion material may be provided.

DESCRIPTION OF EMBODIMENTS (Underlying Knowledge Forming Basis of the Present Disclosure)

A thermoelectric conversion module includes, for example, a p-type thermoelectric conversion material in which holes serve as a carrier and an n-type thermoelectric conversion material in which electrons serve as a carrier. In such a case, the thermoelectric conversion efficiency of the thermoelectric conversion module is determined on the basis of the sum total of the thermoelectric performance of the p-type thermoelectric conversion material and the thermoelectric performance of the n-type thermoelectric conversion material.

A known example of the p-type thermoelectric conversion material is a material that includes Ge and Te. It is considered that the thermoelectric performance of such a material can be enhanced by performing element substitution at Ge sites.

As described above, NPL 1 discloses a thermoelectric conversion material having a composition represented by $(GeTe)_{1-y}(Sb_2Te_3)_y$, where y is 0, 0.05, 0.06, 0.07, or 0.10. NPL 1 also discloses a method for producing the thermoelectric conversion material. For example, according to FIG. 1(h) of NPL 1, it can be understood that regions having high Sb contents and regions having low Sb contents are present in the thermoelectric conversion material in spots on the scale of several tens of micrometers. However, in NPL 1, the detailed state of the regions having high Sb contents is not studied. The impacts of the regions on the thermoelectric performance of the material are also not studied. Moreover, NPL 1 fails to disclose a method for bringing the regions having high Sb contents into a predetermined state.

PTL 1 discloses a nanocomposite material having a composition represented by $(PbTe)_{1-x}(Ag_2Te)_x$. According to PTL 1, it can be understood that performing an appropriate heat treatment causes $Ag_2Te$ to be homogeneously dispersed in the PbTe matrix as a nanoinclusion, which may enhance the thermoelectric performance of the material. However, PTL 1 fails to disclose a thermoelectric conversion material that includes Ge and Te.

The present inventors conducted extensive studies of a thermoelectric conversion material that includes Ge, Te, and Sb. As a result, the present inventors consequently and newly found that the performance of the thermoelectric conversion material can be enhanced by bringing regions of the thermoelectric conversion material which have high Sb contents into a predetermined state. It was found that the novel thermoelectric conversion material has intended electrical characteristics and a low lattice thermal conductivity and is therefore capable of achieving a high figure of merit. The present inventors has devised the thermoelectric conversion material according to the present disclosure on the basis of the above studies.

Embodiment of the Present Disclosure

An embodiment of the present disclosure will be described below with reference to the drawings.

Figure 1:
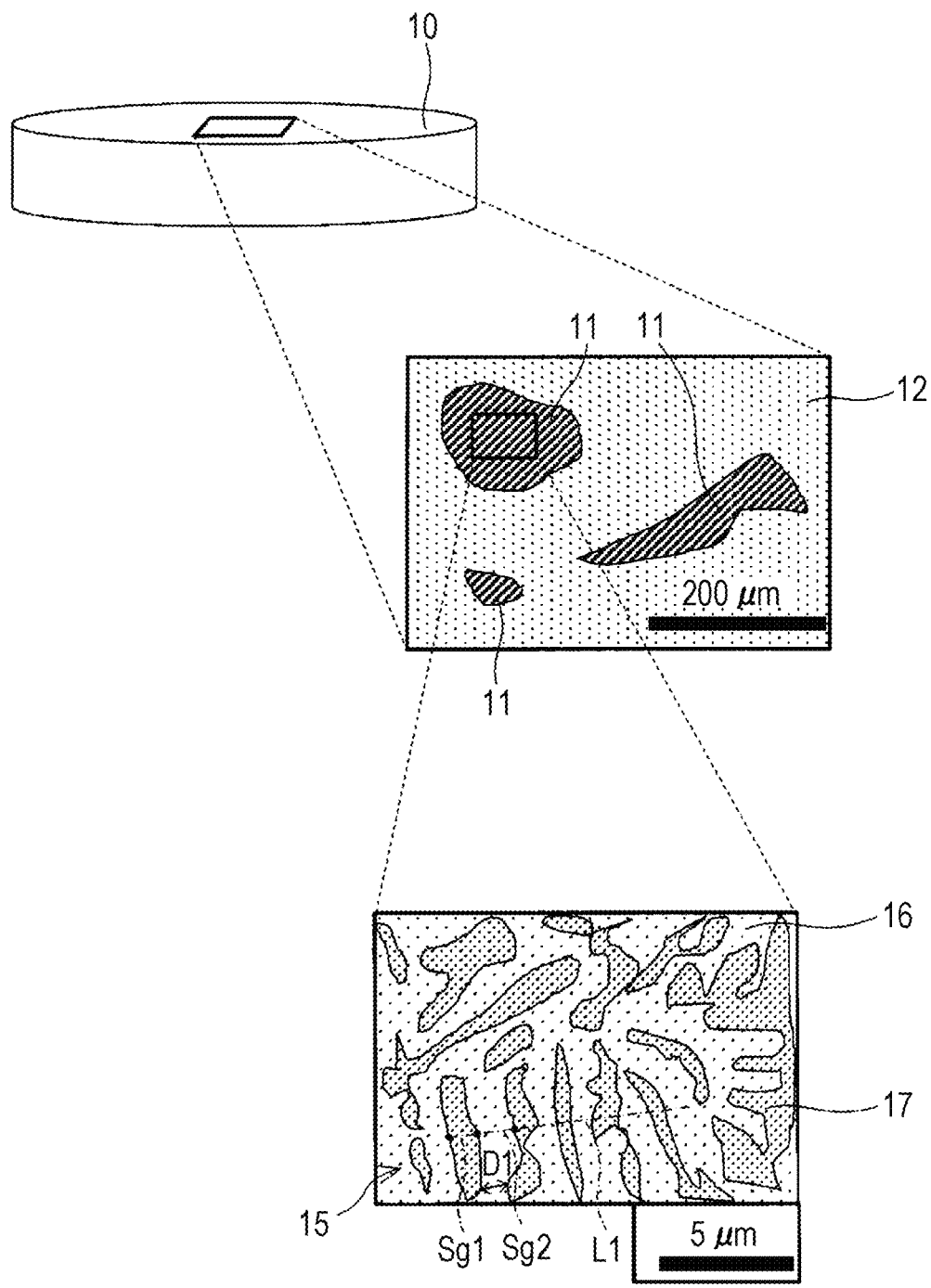
FIG. 1 is a schematic diagram illustrating a thermoelectric conversion material according to the present disclosure.

FIG. 1 is a schematic diagram illustrating a thermoelectric conversion material 10 according to the present disclosure. The thermoelectric conversion material 10 includes Ge, Te, and Sb. The thermoelectric conversion material 10 includes a first region 11 and a second region 12. Each of the first region 11 and the second region 12 includes, for example, Ge, Te, and Sb. The Sb content in the first region 11 in terms of number density of atoms is higher than the Sb content in the second region 12 in terms of number density of atoms. Furthermore, the first region 11 includes a dispersed phase. FIG. 1 schematically illustrates the state of the surface of the thermoelectric conversion material 10 or a polished surface formed by polishing the surface of the thermoelectric conversion material 10.

The performance of the thermoelectric conversion material can be represented by thermoelectric figure of merit ZT. Thermoelectric figure of merit ZT can be represented by $ZT=S^2\sigma T/\kappa$, where S represents Seebeck coefficient, $\sigma$ represents electric conductivity, $\kappa$ represents thermal conductivity, and T represents absolute temperature. Thus, for enhancing the performance of the thermoelectric conversion material, it is advantageous to increase the $S^2\sigma$ value, which is referred to as "power factor", and to decrease thermal conductivity $\kappa$. Thermal conductivity $\kappa$ is the sum of electron thermal conductivity $\kappa_e$ and lattice thermal conductivity $\kappa_l$. Here, $\kappa=\kappa_e+\kappa_l$ is satisfied.

It is considered that, since the first region 11 has a dispersed phase, phonons are likely to be scattered in the thermoelectric conversion material 10 and the lattice thermal conductivity of the thermoelectric conversion material 10 is likely to be decreased. It is advantageous that the thermoelectric conversion material has a low lattice thermal conductivity in order to enhance the thermoelectric performance of the thermoelectric conversion material. Thus, the thermoelectric conversion material 10 is likely to have high thermoelectric performance.

As illustrated in FIG. 1, the first region 11 desirably a lamella structure 15. It is considered that, due to the lamella structure 15, phonons are more likely to be scattered in the thermoelectric conversion material 10 and the lattice thermal conductivity of the thermoelectric conversion material 10 is more likely to be decreased. The lamella structure is one of the types of geometrical structures formed in a substance in a self-organized manner and is a structure formed of an assembly of laminar phases.

The composition of the thermoelectric conversion material 10 is not limited to a specific composition and may be any composition, as long as the first region 11 has a dispersed phase. The thermoelectric conversion material 10 may include, for example, an impurity phase. The impurity phase may be located in the first region, the second region, or a region other than the first or second region. The impurity phase includes, for example, an additive. The additive includes at least one selected from the group consisting of In, Ti, Te, Mg, Mn, Zn, Cu, Cr, Pb, Sn, and Bi.

The thermoelectric conversion material 10 has a composition represented by, for example, $Ge_xSb_yTe_{1-x-y}$. In this composition, for example, x is more than 0.22 and equal to or less than 0.46. Besides, y is equal to or more than 0.04 and less than 0.23. In other words, the composition represented by $Ge_xSb_yTe_{1-x-y}$ satisfies $0.22<x\leq0.46$ and $0.04\leq y<0.23$. The composition of the thermoelectric conversion material 10 can be determined on the basis of, for example, an EDX spectrum obtained by SEM/EDX. In this case, for example, a square region of the surface or polished surface of the thermoelectric conversion material 10 with a side length of 500 μm is targeted for the acquisition of the EDX spectrum.

In the above composition, x may be equal to or more than 0.25 or equal to or more than 0.30. In the above composition, y may be equal to or less than 0.20, equal to or less than 0.18, equal to or less than 0.15, equal to or less than 0.12, or equal to or less than 0.10.

The crystal structure of the thermoelectric conversion material 10 is not limited to a specific crystal structure. The thermoelectric conversion material 10 has, for example, a NaCl-type crystal structure. This allows the thermoelectric conversion material 10 to further have high thermoelectric performance. The crystal structure of the thermoelectric conversion material 10 can be determined by, for example, an analysis based on X-ray diffraction (XRD).

Figure 2:
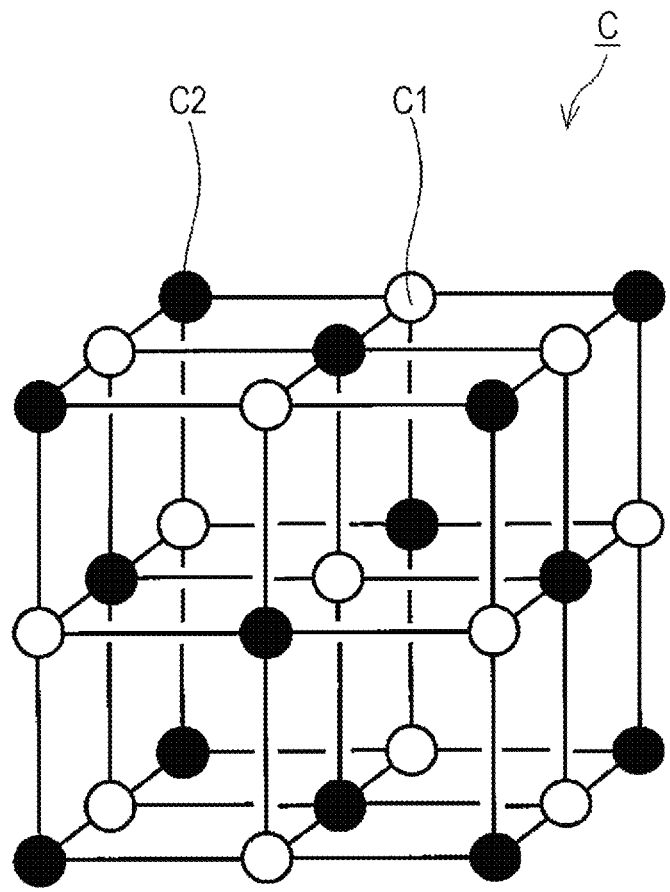
FIG. 2 is a schematic diagram illustrating a NaCl-type crystal structure.

FIG. 2 schematically illustrates a NaCl-type crystal structure. In FIG. 2, C1 denotes a Na site and C2 denotes a C1 site. In the thermoelectric conversion material 10, Ge and Sb may be located at the Na sites and Te may be located at the C1 sites. Note that, in the thermoelectric conversion material 10, all of the sites included in the crystal structure are not necessarily filled; lattice defects, such as holes, may be present in the crystal structure.

The thermoelectric conversion material 10 is, for example, a polycrystalline substance. Each of the crystal grains constituting the polycrystalline substance has, for example, a NaCl-type crystal structure. The space group to which the crystal structure of each of the crystal grains belongs is not limited to a specific space group; the crystal structure of each of the crystal grains belongs to, for example, Space Group Fm-3m or R-3m. The above crystal grains can be observed by obtaining a microscope image of the surface of the thermoelectric conversion material 10. For example, the microscope image is, for example, a reflection electron image taken with a SEM. The surface of the thermoelectric conversion material 10 may be optionally polished prior to the acquisition of the microscope image.

The Sb content in a specific portion of the first region in terms of number density of atoms is, for example, higher than the Sb content in the thermoelectric conversion material 10 in terms of number density of atoms. It is considered that this contributes to the first region 11 having a dispersed phase. The Sb content in the first region 11 in terms of number density of atoms may vary depending on the position of the first region 11. The Sb content in a specific portion of the first region 11 in terms of number density of atoms is, for example, equal to or more than 7%, and may be equal to or more than 9%, equal to or more than 10%, equal to or more than 15%, or equal to or more than 20%. The Sb content in a specific portion of the first region 11 in terms of number density of atoms is, for example, equal to or less than 95% and may be equal to or less than 90% or equal to or less than 89%.

For example, the content of an element other than Sb in the second region 12 is the highest in terms of number density of atoms. The content of Te in the second region 12 may be the highest. In another case, the content of Ge in the second region 12 may be the highest. The Sb content in the second region 12 in terms of number density of atoms may vary depending on the position of the second region 12. The Sb content in a specific portion of the second region 12 in terms of number density of atoms is, for example, equal to or more than 4%. The Sb content in a specific portion of the first region 11 in terms of number density of atoms is, for example, equal to or less than 10%, equal to or less than 8%, or equal to or less than 7%.

As illustrated in FIG. 1, in the thermoelectric conversion material 10, for example, a plurality of first regions 11 are arranged to be spaced from one another. For example, a second region 12 is present between the first regions 11.

The first regions 11 have, for example, a predetermined size. The size of the first regions 11 is equal to or more than 1 μm and equal to or less than 1000 μm. The above size is the maximum diameter of the first regions 11 which can be measured when the surface of the thermoelectric conversion material 10 or a surface formed by polishing the thermoelectric conversion material 10 is observed.

The ratio of the area of the first region 11 to the area of the surface of the thermoelectric conversion material 10 or a surface formed by polishing the thermoelectric conversion material 10 is not limited to a specific value. The above ratio is, for example, equal to or more than 3% and may be equal to or more than 4%. The above ratio is, for example, equal to or less than 8% and may be equal to or less than 7%. An example of the method for determining the above ratio will be described below. A magnified observation image of a predetermined surface of the thermoelectric conversion material 10 is taken using a SEM. The magnified observation image is subjected to a quantitative analysis by EDX with Ge, Sb, and Te being selected as an element. Since C, O, and Al may adhere onto the surface of the thermoelectric conversion material 10 as impurities, these elements may also be considered as an option in the selection of the element. Subsequently, mapping is performed by converting the concentrations of the three elements, that is, Ge, Sb, and Te, in terms of number density of atoms which are determined by the quantitative analysis into lightness, in order to form an image. In the mapping, the above elements are assigned with different colors; for example, red (R), green (G), and blue (B) are assigned to Ge, Sb, and Te, respectively. Then, a threshold value is set to the lightness of the color assigned to Ge. An evaluation image is prepared by highlighting regions of the image created by mapping which have a lightness equal to or more than the threshold value. An evaluation image may alternatively prepared by converting the image created by mapping into a black and white binary image in which white is assigned only to regions having a lightness equal to or more than the threshold value. The ratio of the area of the regions of the evaluation image which have a lightness equal to or more than the threshold value to the total area of the evaluation image is determined as the ratio of the area of the first region 11 to the area of the surface of the thermoelectric conversion material 10 or a surface formed by polishing the thermoelectric conversion material 10.

As illustrated in FIG. 1, the first region 11 includes, for example, a first phase 16 and a second phase 17. The content of Sb in the first phase 16 is the highest in terms of number density of atoms. On the other hand, the content of an element other than Sb in the second phase 17 is the highest in terms of number density of atoms. The content of Te in the second phase 17 may be the highest in terms of number density of atoms. In another case, the content of Ge in the second phase 17 may be the highest in terms of number density of atoms. In such a case, the thermoelectric conversion material 10 is further likely to have high thermoelectric performance. The contents of the above elements in a specific portion of the thermoelectric conversion material 10 can be determined on the basis of, for example, an EDX spectrum obtained by SEM/EDX. The surface of the thermoelectric conversion material 10 which is to be subjected to SEM/EDX may be formed by polishing the thermoelectric conversion material 10.

The Sb content in the first phase 16 in terms of number density of atoms is, for example, equal to or more than 60% and may be equal to or more than 70%, equal to or more than 80%, or equal to or more than 83%. The Sb content in the first phase 16 in terms of number density of atoms is, for example, equal to or less than 98% and may be equal to or less than 95%, equal to or less than 90%, or equal to or less than 89%.

The Sb content in the second phase 17 in terms of number density of atoms is, for example, equal to or more than 4% and may be equal to or more than 5% or equal to or more than 7%. The Sb content in the second phase 17 in terms of number density of atoms is, for example, equal to or less than 40% and may be equal to or less than 30%, equal to or less than 25%, or equal to or less than 22%.

As illustrated in FIG. 1, for example, in the first region 11, the second phase 17 serves as a dispersed phase. In other words, in the first region 11, a plurality of second phases 17 are arranged to be spaced from one another. This structure allows the thermoelectric conversion material 10 to further have high thermoelectric performance.

As illustrated in FIG. 1, the first phase 16 is, for example, present between the second phases 17. This structure allows the thermoelectric conversion material 10 to further have high thermoelectric performance. For example, in the first region 11, the first phase 16 serves as a continuous phase, while the second phases 17, which are dispersed phases, are scattered so as to be surrounded by the continuous phase.

As illustrated in FIG. 1, the first region 11 includes a plurality of second phases 17 arranged in a specific direction. This structure allows the thermoelectric conversion material 10 to further have high thermoelectric performance.

In FIG. 1, the straight line L1 is a straight line that extends, in a specific direction, across a pair of second phases 17 adjacent to each other in the specific direction. The sum Lt of the length of a first line segment Sg1 and the length of a second line segment Sg2 of the straight line L1 is not limited to a specific value. The sum Lt is, for example, equal to or less than 5 µm. In other words, for example, Lt≤5 µm is satisfied. In such a case, phonons are further likely to be scattered in the thermoelectric conversion material 10 and, consequently, the thermoelectric conversion material 10 is further likely to have high thermoelectric performance. Note that the first line segment Sg1 is a line segment that connects both ends of one of the pair of second phases 17 to each other. The second line segment Sg2 is a line segment that extends between the other of the pair of second phases 17 and the first line segment Sg1.

The sum of the lengths of the first and second line segments Sg1 and Sg2 may be equal to or less than 4 µm, equal to or less than 3 µm, equal to or less than 2 µm, or equal to or less than 1 µm. The sum of the lengths of the first and second line segments Sg1 and Sg2 is, for example, equal to or more than 0.05 µm and may be equal to or more than 0.07 µm, equal to or more than 0.1 µm, equal to or more than 0.2 µm, or equal to or more than 0.5 µm.

The minimum distance D1 between the second phases 17 is not limited to a specific value. The minimum distance D1 is, for example, equal to or less than 2.3 µm. In other words, for example, D1≤2.3 µm is satisfied. In such a case, phonons are further likely to be scattered in the thermoelectric conversion material 10 and, consequently, the thermoelectric conversion material 10 is further likely to have high thermoelectric performance.

The minimum distance D1 may be equal to or less than 2.2 µm, equal to or less than 2.0 µm, equal to or less than 1.5 µm, or equal to or less than 1.0 µm. The minimum distance D1 is, for example, equal to or more than 0.05 µm and may be equal to or more than 0.06 µm or equal to or more than 0.1 µm.

A method for producing the thermoelectric conversion material 10 is not limited to a specific method. The thermoelectric conversion material 10 can be produced by, for example, annealing a solid prepared by melting a mixture including Ge, Te, and Sb. This enables the dispersed phase to be formed in the first region 11 of the thermoelectric conversion material 10 with further certainty.

An example of the method for producing the thermoelectric conversion material 10 will be described below. Predetermined amounts of Ge, Sb, and Te are weighed in an inert gas atmosphere. The predetermined amounts of Ge, Sb, and Te weighed are charged into a carbon crucible. The crucible is charged into a stainless steel pipe, and both ends of the pipe are sealed with a stainless steel cap. The temperature of the inside of the stainless steel pipe containing Ge, Sb, and Te is maintained at 750° C. or more for at least 6 hours to melt Ge, Sb, and Te. Subsequently, cooling is gradually performed over 10 hours or more to prepare a polycrystalline substance including Ge, Sb, and Te. Then, the polycrystalline substance is subjected to an annealing treatment at 300° C. or more for at least 10 hours. Desirably, in the annealing treatment, the ambient temperature of the polycrystalline substance is adjusted to a temperature equal to or more than 300° C. and equal to or less than 500° C. and the heat treatment is performed for 20 hours or more. More desirably, in the annealing treatment, the ambient temperature of the polycrystalline substance is adjusted to a temperature equal to or more than 300° C. and equal to or less than 500° C. and the heat treatment is performed for 40 hours or more. The thermoelectric conversion material 10 can be produced in the above-described manner.

Figure 3:
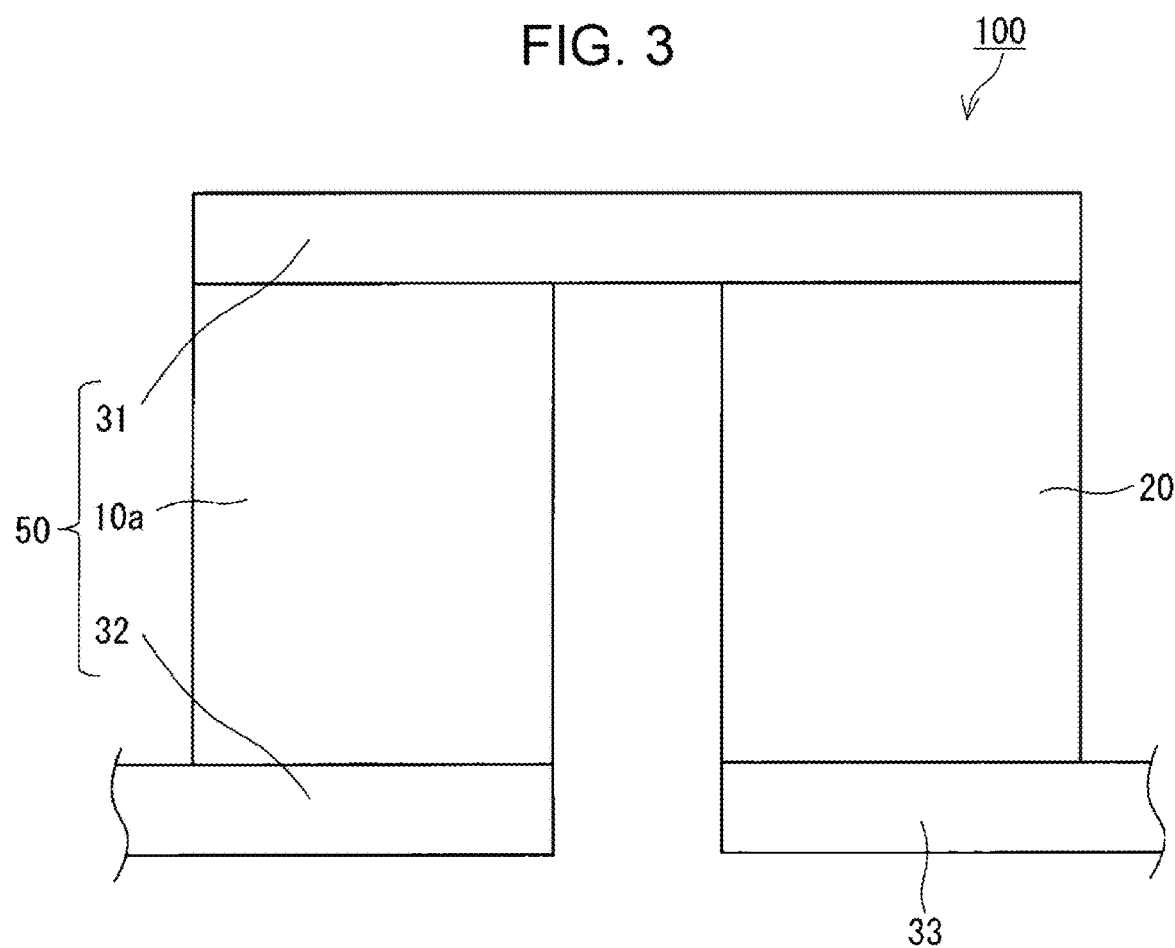
FIG. 3 is a schematic diagram illustrating an example of a thermoelectric conversion element according to the present disclosure.

Using the thermoelectric conversion material 10, a thermoelectric conversion element and a thermoelectric conversion module can be provided. FIG. 3 illustrates a example of the thermoelectric conversion element and the thermoelectric conversion module.

As illustrated in FIG. 3, a thermoelectric conversion element 50 includes a thermoelectric conversion member 10a, a first electrode 31, and a second electrode 32. The first electrode 31 is electrically connected to an end of the thermoelectric conversion member 10a, while the second electrode 32 is electrically connected to the other end of the thermoelectric conversion member 10a. The thermoelectric conversion member 10a includes the above-described thermoelectric conversion material 10. Thus, the thermoelectric conversion element 50 is likely to have high thermoelectric performance.

As illustrated in FIG. 3, in a thermoelectric conversion module 100, the thermoelectric conversion member 10a is, for example, a p-type thermoelectric conversion member. The thermoelectric conversion module 100 includes, for example, the p-type thermoelectric conversion member 10a and an n-type thermoelectric conversion member 20. The p-type thermoelectric conversion member 10a and the n-type thermoelectric conversion member 20 are electrically connected to each other. The thermoelectric conversion module 100 further includes, for example, a first electrode 31, a second electrode 32, and a third electrode 33. The first electrode 31 electrically connects an end of the p-type thermoelectric conversion member 10a and an end of the n-type thermoelectric conversion member 20 to each other. The second electrode 32 is electrically connected to the other end of the p-type thermoelectric conversion member 10a. The third electrode 33 is electrically connected to the other end of the n-type thermoelectric conversion member 20. The n-type thermoelectric conversion member 20 may include a publicly known n-type thermoelectric conversion material.

In the thermoelectric conversion module 100, for example, an end of the p-type thermoelectric conversion member 10a and an end of the n-type thermoelectric conversion member 20 are located on the same side in a specific direction. For example, when a difference in temperature is generated between the ends of the p-type thermoelectric conversion member 10a, a thermoelectromotive force is generated in the p-type thermoelectric conversion member 10a. In addition, when a difference in temperature is generated between the ends of the n-type thermoelectric conversion member 20, a thermoelectromotive force is generated in the n-type thermoelectric conversion member 20. Thus, electric power can be generated in the thermoelectric conversion module 100.

When a current is generated in the thermoelectric conversion module 100, for example, heat is transported from an end of the p-type thermoelectric conversion member 10a to the other end and heat is transported from an end of the n-type thermoelectric conversion member 20 to the other end. When a current is generated in the thermoelectric conversion module 100 in a reverse direction, heat is transported from the other end of the p-type thermoelectric conversion member 10a to the end and heat is transported from the other end of the n-type thermoelectric conversion member 20 to the end.

EXAMPLES

Details of the present disclosure are described with reference to Examples below. Note that the thermoelectric conversion material according to the present disclosure is not limited by Examples below.

Example 1

Predetermined amounts of particulate Ge, particulate Sb, and particulate Te were weighed in a glove box having an argon atmosphere. The mass and amount of substance of the particulate Ge were 3.500 g and 0.04819 moles, respectively. The mass and amount of substance of the particulate Sb were 0.619 g and 0.00507 moles, respectively. The mass and amount of substance of the particulate Te were 7.121 g and 0.05580 moles, respectively. The molar ratio among Ge, Sb, and Te in the starting material used in Example 1 was Ge:Sb:Te=44:5:51. The thus-weighed amounts of Ge, Sb, and Te were charged into a carbon crucible having an inside diameter of 15 mm, and a carbon lid having a diameter of 15 mm was placed on the crucible. The crucible containing Ge, Sb, and Te was charged into a stainless steel pipe having a diameter of 20 mm, and both ends of the stainless steel pipe were sealed with a stainless steel cap.

Subsequently, the stainless steel pipe was placed in a tabletop muffle furnace NMF-120B. While the temperature of the inside of the muffle furnace was maintained at 750° C. for 6 hours or more, Ge, Sb, and Te were melted. Then, the molten substance was gradually cooled over 10 hours or more. Hereby, a polycrystalline substance including Ge, Sb, and Te was prepared. The prepared polycrystalline substance was charged into a small electric furnace mini-BSI placed inside a glove box having an argon atmosphere and subjected to an annealing treatment at 300° C. or more for 40 hours or more. A thermoelectric conversion material of Example 1 was prepared in the above-described manner.

Comparative Example 1

A thermoelectric conversion material of Comparative Example 1 was prepared as a polycrystalline substance including Ge, Sb, and Te similarly to Example 1, except that the annealing treatment performed using a small electric furnace was omitted.

[Analysis of Crystal Structure]

Samples prepared by pulverizing the thermoelectric conversion materials prepared in Example 1 and Comparative Example 1 to a sufficient degree with a mortar were subjected to an XRD analysis. In the XRD analysis, an X-ray diffractometer Aeris produced by Malvern Panalytical was used. Cu-Kα radiation was used as an X-ray.

Figure 4A:
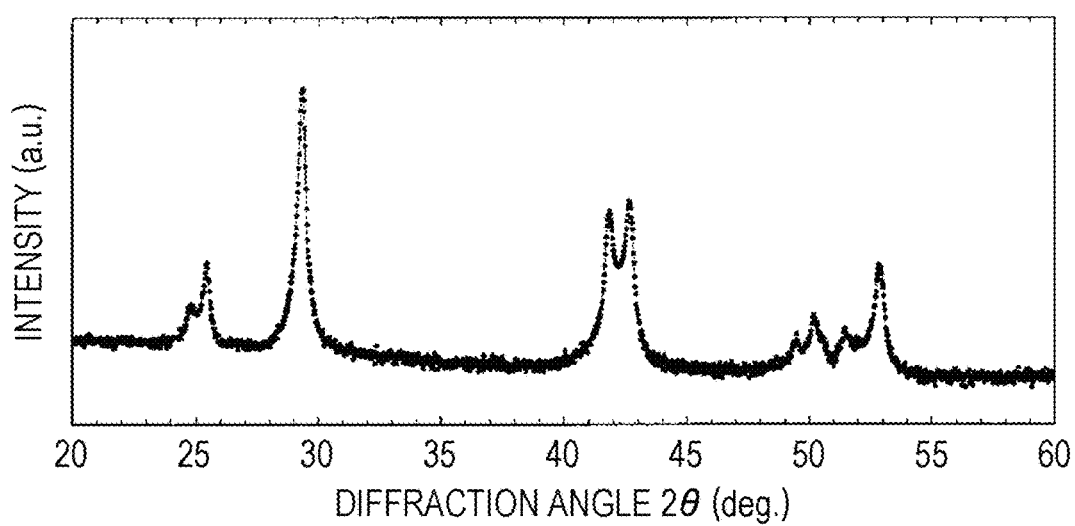
FIG. 4A is a graph illustrating an X-ray diffraction (XRD) pattern of a thermoelectric conversion material prepared in Example 1.
Figure 4B:
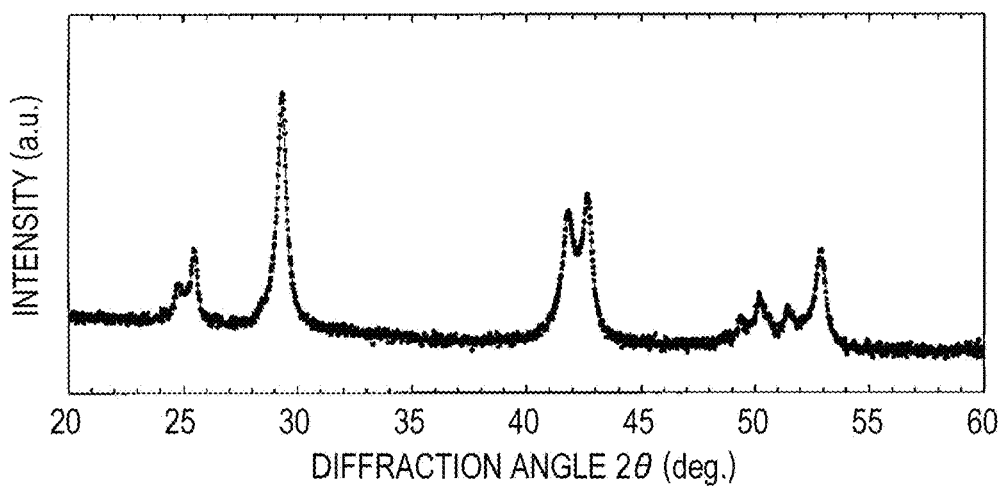
FIG. 4B is a graph illustrating an XRD pattern of a thermoelectric conversion material prepared in Comparative Example 1.
Figure 4C:
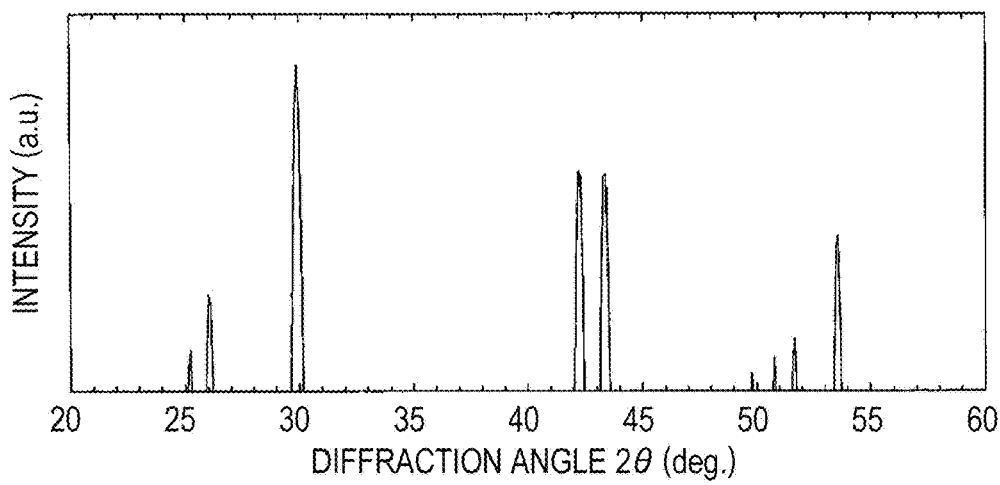
FIG. 4C is a graph illustrating the results of simulation of an XRD pattern of GeTe having a crystal structure belonging to Space Group R-3m.

FIGS. 4A and 4B are graphs illustrating the XRD patterns of the thermoelectric conversion materials of Example 1 and Comparative Example 1. FIG. 4C illustrates the simulation results of the XRD pattern of a trigonal structure belonging to Space Group R-3 μm which has a lattice constant of 0.601 nanometers. The diffraction peaks of the XRD patterns illustrated in FIGS. 4A and 4B accord with the diffraction peaks of the simulated XRD pattern illustrated in FIG. 4C. Thus, it is understood that the thermoelectric conversion materials of Example 1 and Comparative Example 1 had a trigonal structure belonging to Space Group R-3 μm.

[Analysis of Microstructure]

The thermoelectric conversion materials of Example 1 and Comparative Example 1 were subjected to SEM-EDX. In SEM-EDX, SEM SU8220 produced by Hitachi High-Tech Corporation was used.

Figure 5A:
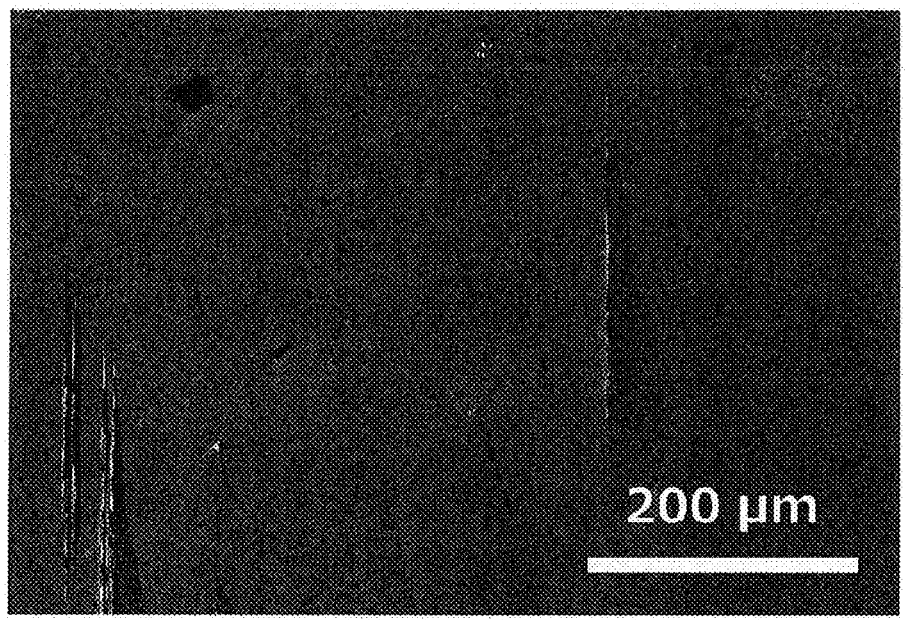
FIG. 5A is a reflection electron image of the surface of the thermoelectric conversion material prepared in Example 1, which is taken with a scanning electron microscope (SEM).
Figure 5B:
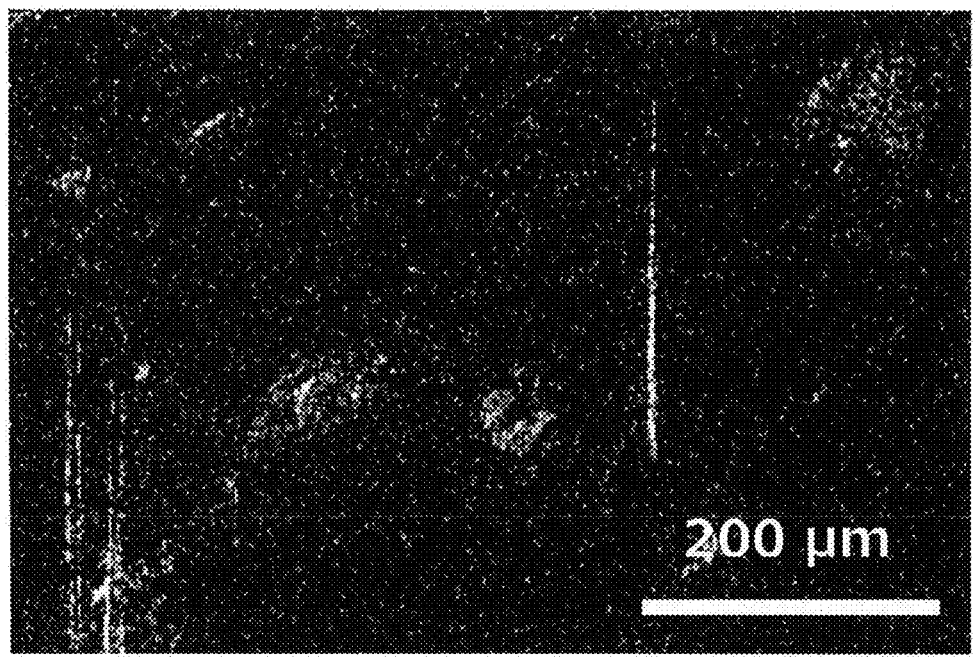
FIG. 5B is an image obtained by mapping of characteristic X-ray intensity of Sb on the surface of the thermoelectric conversion material of Example 1 taken by energy dispersive X-ray spectroscopy (EDX).

FIG. 5A illustrates a reflection electron image of the surface of the thermoelectric conversion material of Example 1 taken with a SEM. FIG. 5B illustrates an image obtained by mapping of characteristic X-ray intensity of Sb on the surface of the thermoelectric conversion material of Example 1 by EDX. The energy of the characteristic X-ray Lα of Sb is 3.604 keV. As illustrated in FIG. 5A, the regions A and B were observed in the thermoelectric conversion material of Example 1. The Sb content in the region A in terms of number density of atoms was higher than the Sb content in the region B in terms of number density of atoms. The size (maximum diameter) of the region A was a few micrometers to several hundred micrometers. The ratio of the area of the region A to the area of the entire image was calculated on the basis of FIG. 5B. As a result, the above ratio was about 4%.

Figure 6A:
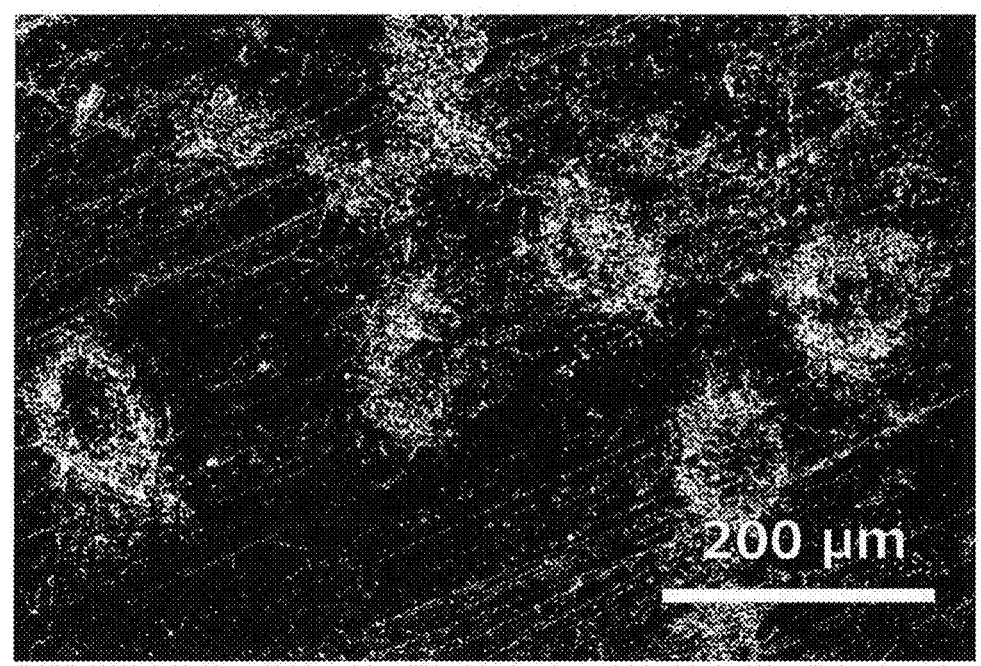
FIG. 6A is a reflection electron image of the surface of the thermoelectric conversion material prepared in Comparative Example 1, which is taken with a SEM.
Figure 6B:
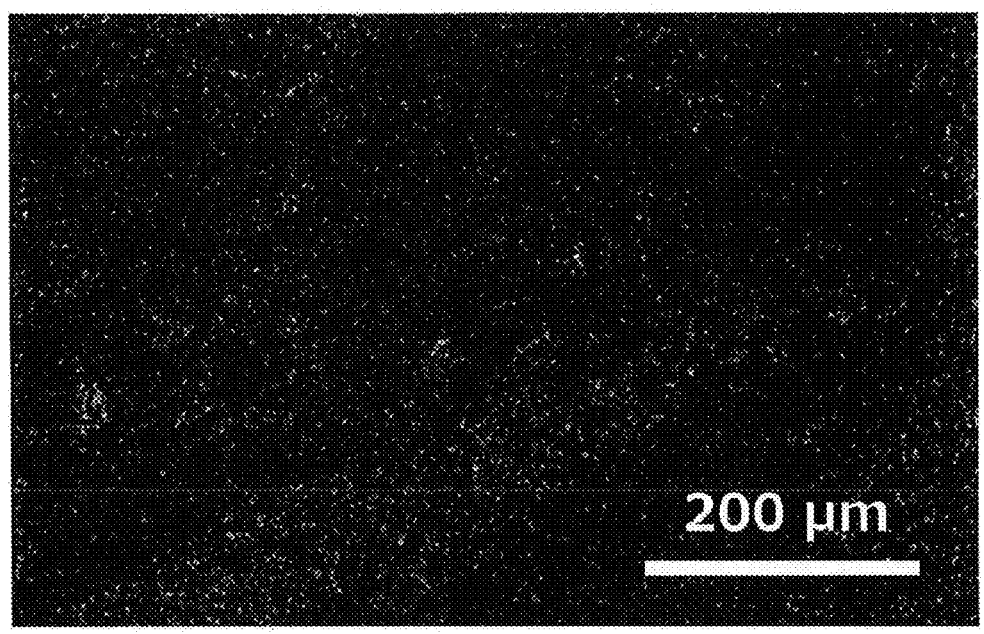
FIG. 6B is an image obtained by mapping of characteristic X-ray intensity of Sb on the surface of the thermoelectric conversion material of Comparative Example 1 by EDX.

FIG. 6A illustrates a reflection electron image of the surface of the thermoelectric conversion material of Comparative Example 1 taken with a SEM. FIG. 6B illustrates an image obtained by mapping of characteristic X-ray intensity of Sb on the surface of the thermoelectric conversion material of Comparative Example 1 by EDX. The results illustrated in FIG. 6B confirm that Sb was homogeneously distributed in the thermoelectric conversion material of Comparative Example 1, unlike the thermoelectric conversion material of Example 1. Thus, it was found that, when a polycrystalline substance including Ge, Sb, and Te is subjected to an annealing treatment at 300° C. or more for 40 hours or more, crystals are grown such that two regions in which the Sb contents in terms of number density of atoms are different from each other are formed.

[Observation of Lamella Structure]

Figure 7A:
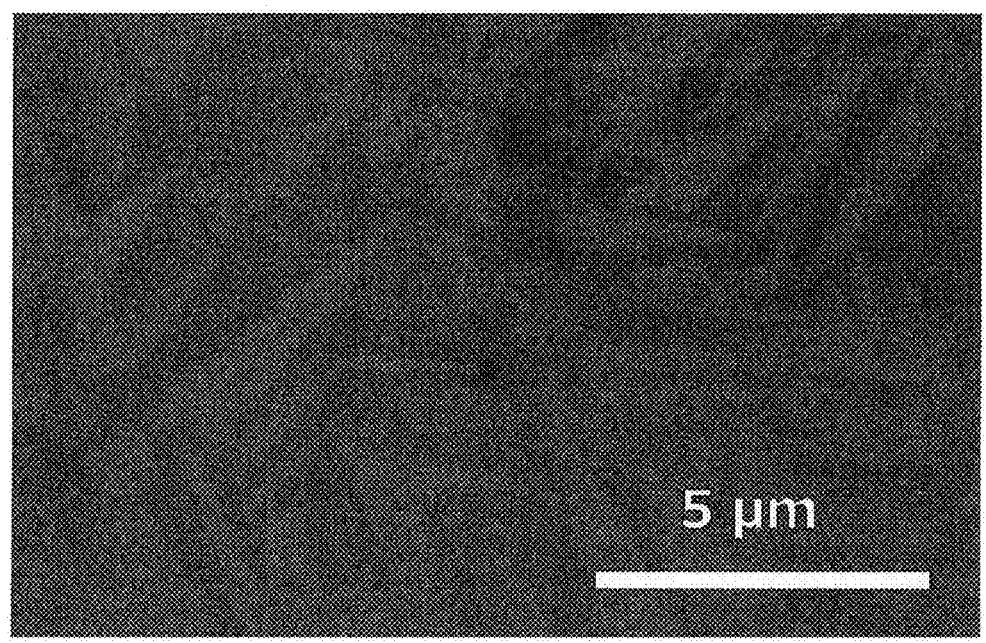
FIG. 7A is a magnified image of a region of the reflection electron image illustrated in FIG. 5A in which the Sb content is high.
Figure 7B:
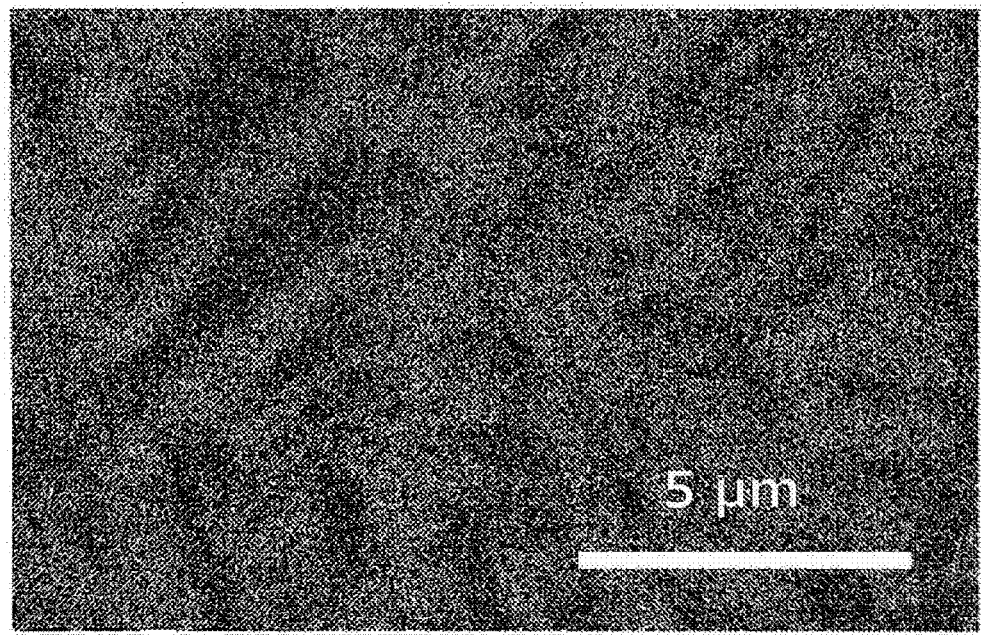
FIG. 7B is an image obtained by mapping of characteristic X-ray intensity of Sb on the region of the thermoelectric conversion material of Example 1 which is illustrated in FIG. 7A by EDX.

FIG. 7A is a magnified image of the region A of the reflection electron image illustrated in FIG. 5A in which the Sb content is high. FIG. 7B is an image obtained by mapping of characteristic X-ray intensity of Sb on the region illustrated in FIG. 7A by EDX. As illustrated in FIGS. 7A and 7B, the region A had a lamella structure that was an assembly of laminar phases. The lamella structure included an α phase in which the Sb content was the highest in terms of number density of atoms and a β phase in which the content of an element other than Sb was the highest in terms of number density of atoms. The region A included a plurality of tabular β phases arranged in a specific direction. Moreover, on the assumption that the regions that appear darker than the periphery in FIG. 7B correspond to the β phase, FIG. 7B suggests that the distance between the β phases be equal to or more than 0.06 μm and equal to or less than 2.26 μm.

[Evaluation of Composition]

Fitting was performed on the assumption that the EDX spectrum of the surface of the thermoelectric conversion material of Example 1 was composed only of the characteristic X-rays of Ge, Sb, and Te, in order to determine the ratio of the number of atoms of each of the elements to the sum total of the numbers of atoms of Ge, Sb, and Te. Table 1 lists the results. As shown in Table 1, the ratio of numbers of atoms of Ge, Sb, and Te in the α phase of the region A was Ge:Sb:Te=equal to or more than 7 and equal to or less than 9:equal to or more than 83 and equal to or less than 89:equal to or more than 3 and equal to or less than 8. The ratio of numbers of atoms of Ge, Sb, and Te in the β phase of the region A was Ge:Sb:Te=equal to or more than 27 and equal to or less than 44:equal to or more than 7 and equal to or less than 22:equal to or more than 46 and equal to or less than 62. The ratio of numbers of atoms of Ge, Sb, and Te in the region B was Ge:Sb:Te=equal to or more than 43 and equal to or less than 46:equal to or more than 4 and equal to or less than 7:equal to or more than 49 and equal to or less than 50. Furthermore, the ratio of numbers of atoms of Ge, Sb, and Te in a square region of the surface of the thermoelectric conversion material of Example 1 with a side length of 500 μm to the sum total of the numbers of atoms of Ge, Sb, and Te in the square region was determined in the same manner as described above. The ratio of numbers of atoms of Ge, Sb, and Te in this square region was Ge:Sb:Te=46: 4:50. Note that the ratio of numbers of atoms of Ge, Sb, and Te in this square region is considered substantially equal to the ratio of numbers of atoms of Ge, Sb, and Te over the entire thermoelectric conversion material in consideration of the size of the square region.

[Evaluation of Properties of Thermoelectric Conversion Material]

Figure 8A:
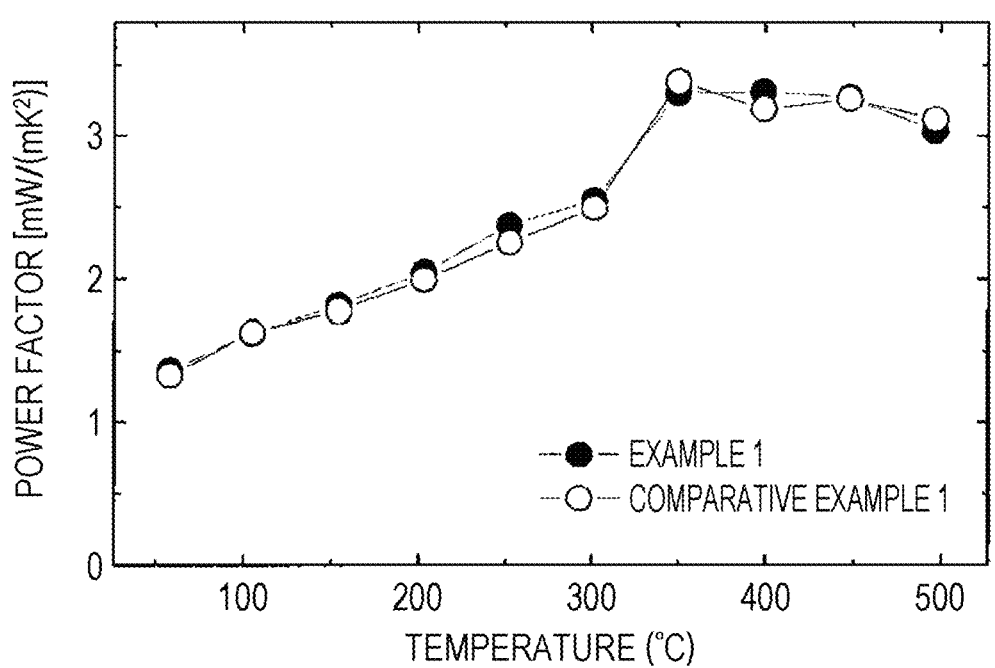
FIG. 8A is a graph illustrating the relationship between the patter factor of each of the thermoelectric conversion materials of Example 1 and Comparative Example 1 and temperature.
Figure 8B:
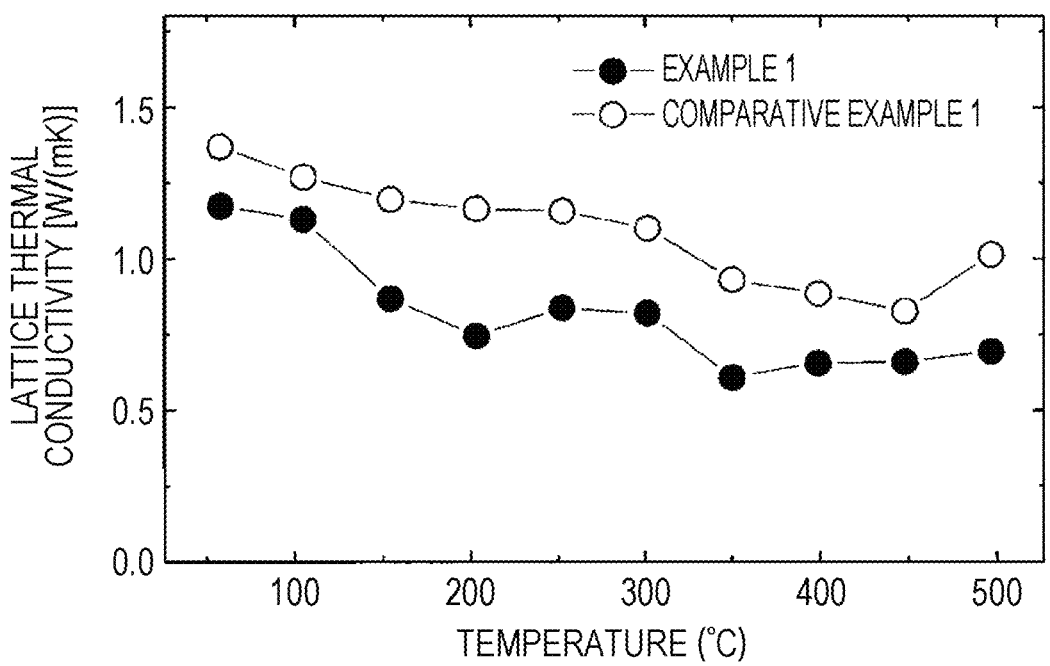
FIG. 8B is a graph illustrating the relationship between the lattice thermal conductivity of each of the thermoelectric conversion materials of Example 1 and Comparative Example 1 and temperature.
Figure 8C:
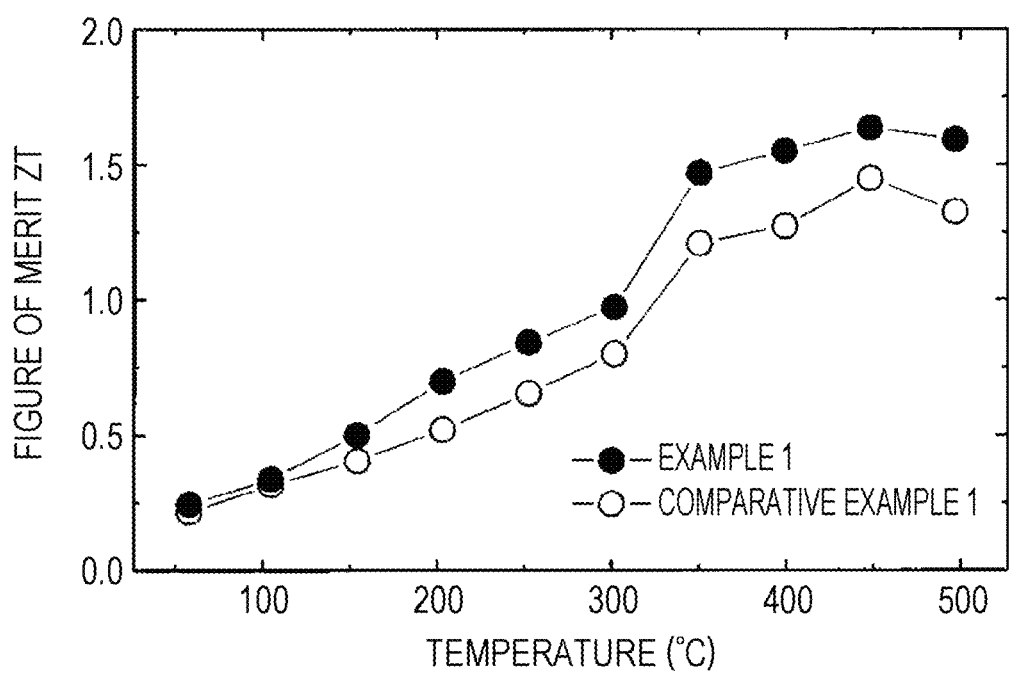
FIG. 8C is a graph illustrating the relationship between the figure of merit ZT of each of the thermoelectric conversion materials of Example 1 and Comparative Example 1 and temperature.

The power factor $S^2\sigma$, lattice thermal conductivity $\kappa_l$, and thermoelectric figure of merit ZT of each of the thermoelectric conversion materials of Example 1 and Comparative Example 1 were measured using a thermoelectric evaluation system ZEM-3 produced by ADVANCE RIKO, Inc. FIGS. 8A, 8B, and 8C illustrate the results. The $S^2\sigma$ values of the thermoelectric conversion materials of Example 1 and Comparative Example 1 were substantially equal to each other. On the other hand, the lattice thermal conductivity $\kappa_l$ of the thermoelectric conversion material of Example 1 was markedly lower than the lattice thermal conductivity $\kappa_l$ of the thermoelectric conversion material of Comparative Example 1. As a result, the ZT of the thermoelectric conversion material of Example 1 was high. It is considered that the lamella structure formed in the region A of the thermoelectric conversion material of Example 1 does not hardly affect the transportation of electrons and enables only the phonons to be scattered in an effective manner. It is understood that, for the above reason, the lamella structure decreases the lattice thermal conductivity $\kappa_l$ of the thermoelectric conversion material and enhances the ZT of the thermoelectric conversion material.

TABLE 1

| Position at which EDX spectrum was measured | | Ratio of number of atoms of each element to sum total of the numbers of atoms [%] | | |
|---|---|---|---|---|
| | | Ge | Sb | Te |
| Region A | α Phase | 8.9 | 83.5 | 7.6 |
| | | 7.8 | 88.7 | 3.5 |
| | | 7.5 | 87.4 | 5.1 |
| | | 8.4 | 86.7 | 5.0 |
| | | 8.1 | 85.7 | 6.3 |
| | β Phase | 32.2 | 21.6 | 46.2 |
| | | 36.8 | 14.9 | 48.2 |
| | | 43.6 | 7.3 | 49.0 |
| | | 39.6 | 9.5 | 50.9 |
| | | 27.3 | 11.3 | 61.4 |
| Region B | | 43.6 | 4.6 | 49.1 |
| | | 45.6 | 7.3 | 49.5 |
| | | 45.3 | 5.4 | 49.4 |
| | | 45.9 | 4.9 | 49.4 |

REFERENCE SIGNS LIST 10 thermoelectric conversion material
10a thermoelectric conversion member (p-type thermoelectric conversion member)
11 first region
12 second region
15 lamella structure
16 first phase
17 second phase
20 n-type thermoelectric conversion member
31 first electrode
32 second electrode
33 third electrode
50 thermoelectric conversion element
100 thermoelectric conversion module
L1 straight line
Sg1 first line segment
Sg2 second line segment
D1 minimum distance

The invention claimed is:

1. A thermoelectric conversion material comprising Ge, Te, and Sb, wherein
    the thermoelectric conversion material comprises first region and second region,
    a content of Sb in the first region in terms of number density of atoms is higher than a content of Sb in the second region in terms of number density of atoms, and
    the first region comprises a dispersed phase.

2. The thermoelectric conversion material according to claim 1, wherein
    the first region has a lamella structure.

3. The thermoelectric conversion material according to claim 1, wherein
    the first region comprises first phase and second phase,
    a content of Sb in the first phase is the highest in terms of number density of atoms, and
    a content of an element other than Sb in the second phase is the highest in terms of number density of atoms.

4. The thermoelectric conversion material according to claim 3, wherein
    in the first region, the second phase serves as the dispersed phase.

5. The thermoelectric conversion material according to claim 4, wherein
    the first phase is present between parts of the second phase.

6. The thermoelectric conversion material according to claim 4, wherein
    the first region comprises a plurality of tabular parts of the second phase, the tabular parts being arranged in a specific direction.

7. The thermoelectric conversion material according to claim 6, wherein
    in a straight line that extends across a pair of parts of the second phase in the specific direction, the pair of parts being adjacent to each other in the specific direction, a sum Lt of a length of a first line segment that connects both ends of one of the pair of parts of the second phase to each other and a length of a second line segment that extends between another of the pair of parts of the second phase and the first line segment satisfies Lt≤5 μm.

8. The thermoelectric conversion material according to claim 3, wherein
    a minimum distance D1 between the parts of the second phase satisfies D1≤2.3 μm.

9. The thermoelectric conversion material according to claim 1, wherein
   a content of Sb in a specific portion of the first region in terms of number density of atoms is higher than a content of Sb in the thermoelectric conversion material in terms of number density of atoms.

10. The thermoelectric conversion material according to claim 1, wherein
   a content of an element other than Sb in the second region is the highest in terms of number density of atoms.

11. The thermoelectric conversion material according to claim 1, wherein
   the thermoelectric conversion material has a composition represented by $Ge_xSb_yTe_{1-x-y}$, and
   the composition satisfies $0.22 < x \leq 0.46$ and $0.04 \leq y < 0.23$.

12. A thermoelectric conversion element comprising:
   a thermoelectric conversion member;
   a first electrode electrically connected to an end of the thermoelectric conversion member; and
   a second electrode electrically connected to another end of the thermoelectric conversion member,
   wherein
   the thermoelectric conversion member comprises the thermoelectric conversion material according to claim 1.

13. A thermoelectric conversion module comprising:
   a p-type thermoelectric conversion member; and
   an n-type thermoelectric conversion member,
   wherein
   the p-type thermoelectric conversion member comprises the thermoelectric conversion material according to claim 1, and
   the p-type and n-type thermoelectric conversion members are electrically connected to each other.

14. A method for producing a thermoelectric conversion material, the method comprising:
   annealing a solid prepared by melting a mixture including Ge, Te, and Sb to form the thermoelectric conversion material according to claim 1.

\* \* \* \* \*